(12) United States Patent
Iinuma

(10) Patent No.: US 9,412,754 B1
(45) Date of Patent: Aug. 9, 2016

(54) SEMICONDUCTOR MEMORY DEVICE AND PRODUCTION METHOD THEREOF

(71) Applicant: KABUSHIKI KAISHA TOSHIBA, Minato-ku (JP)

(72) Inventor: Toshihiko Iinuma, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/850,490

(22) Filed: Sep. 10, 2015

Related U.S. Application Data

(60) Provisional application No. 62/132,135, filed on Mar. 12, 2015.

(51) Int. Cl.
| | | |
|---|---|---|
| H01L 27/115 | (2006.01) | |
| H01L 29/792 | (2006.01) | |
| H01L 29/45 | (2006.01) | |
| H01L 29/417 | (2006.01) | |

(52) U.S. Cl.
CPC ...... *H01L 27/1157* (2013.01); *H01L 27/11582* (2013.01); *H01L 29/41741* (2013.01); *H01L 29/456* (2013.01)

(58) Field of Classification Search
CPC ............ H01L 27/11519; H01L 27/1157; H01L 27/11556; H01L 27/11582; H01L 29/792; H01L 29/7926
See application file for complete search history.

(56) References Cited

U.S. PATENT DOCUMENTS

| | | |
|---|---|---|
| 2012/0098050 A1 | 4/2012 | Shim et al. |
| 2013/0009235 A1 | 1/2013 | Yoo |
| 2013/0214344 A1 | 8/2013 | Lim et al. |
| 2013/0264626 A1 | 10/2013 | Sawa |

FOREIGN PATENT DOCUMENTS

| | | |
|---|---|---|
| JP | 2012-094869 | 5/2012 |
| JP | 2013-021322 | 1/2013 |
| JP | 2013-219239 | 10/2013 |

*Primary Examiner* — Thanh V Pham
(74) *Attorney, Agent, or Firm* — Oblon, McClelland, Maier & Neustadt, L.L.P.

(57) ABSTRACT

A semiconductor memory device includes a silicon substrate having an impurity diffusion region, and a memory cell array. The memory cell array includes conductive layers laminated on the silicon substrate via interlayer insulation layers, a semiconductor layer extending in a direction of the lamination of the conductive layers, a charge storage film disposed between the conductive layers and the semiconductor layer, and an electrode disposed on the conductive layers. A groove having a direction of the lamination as a depth direction and a first direction different from the lamination direction as a lengthwise direction is formed through the conductive layers. The silicon substrate includes a silicide film disposed in the impurity diffusion region along the groove. The memory cell array includes a conductor, which is in contact with the electrode and the silicide film, in the groove. In the first direction, the conductor is shorter in length than the groove.

15 Claims, 14 Drawing Sheets

CONTACT REGION | MEMORY CELL EGION | CONTACT REGION

CONTACT REGION | MEMORY CELL REGION | CONTACT REGION

CONTACT REGION | MEMORY CELL REGION | CONTACT REGION

SEMICONDUCTOR MEMORY DEVICE AND PRODUCTION METHOD THEREOF

CROSS-REFERENCE TO RELATED APPLICATIONS

This application is based upon and claims the benefit of priority from the prior U.S. Provisional Application 62/132,135, filed on Mar. 12, 2015, the entire contents of which are incorporated herein by reference.

BACKGROUND

1. Field

The present invention relates to a semiconductor memory device and a production method thereof.

2. Description of the Related Art

As one kind of semiconductor memory devices, there is flash memory. In particular, the NAND-type flash memory is generally widely used because of the low cost and large capacity. Furthermore, up to now, a large number of techniques for further increasing the capacity of the NAND-type flash memory have been proposed. One of the proposed techniques is a structure in which memory cells are disposed in a three-dimensional manner.

DETAILED DESCRIPTION

A semiconductor memory device includes a silicon substrate having an impurity diffusion region, and a memory cell array. The memory cell array includes conductive layers laminated on the silicon substrate via interlayer insulation layers, a semiconductor layer extending in a direction of the lamination of the conductive layers, a charge storage film disposed between the conductive layers and the semiconductor layer, and an electrode disposed on the conductive layers. A groove having a direction of the lamination as a depth direction and a first direction different from the lamination direction as a lengthwise direction is formed through the conductive layers.

The silicon substrate includes a silicide film disposed in the impurity diffusion region along the groove. The memory cell array includes a conductor, which is in contact with the electrode and the silicide film, in the groove. In the first direction, the conductor is shorter in length than the groove.

Hereafter, semiconductor memory devices according to embodiments and production methods of them will be described with reference to the drawings.

First Embodiment

First, a general configuration of a semiconductor memory device according to a first embodiment will now be described.

Figure 1:
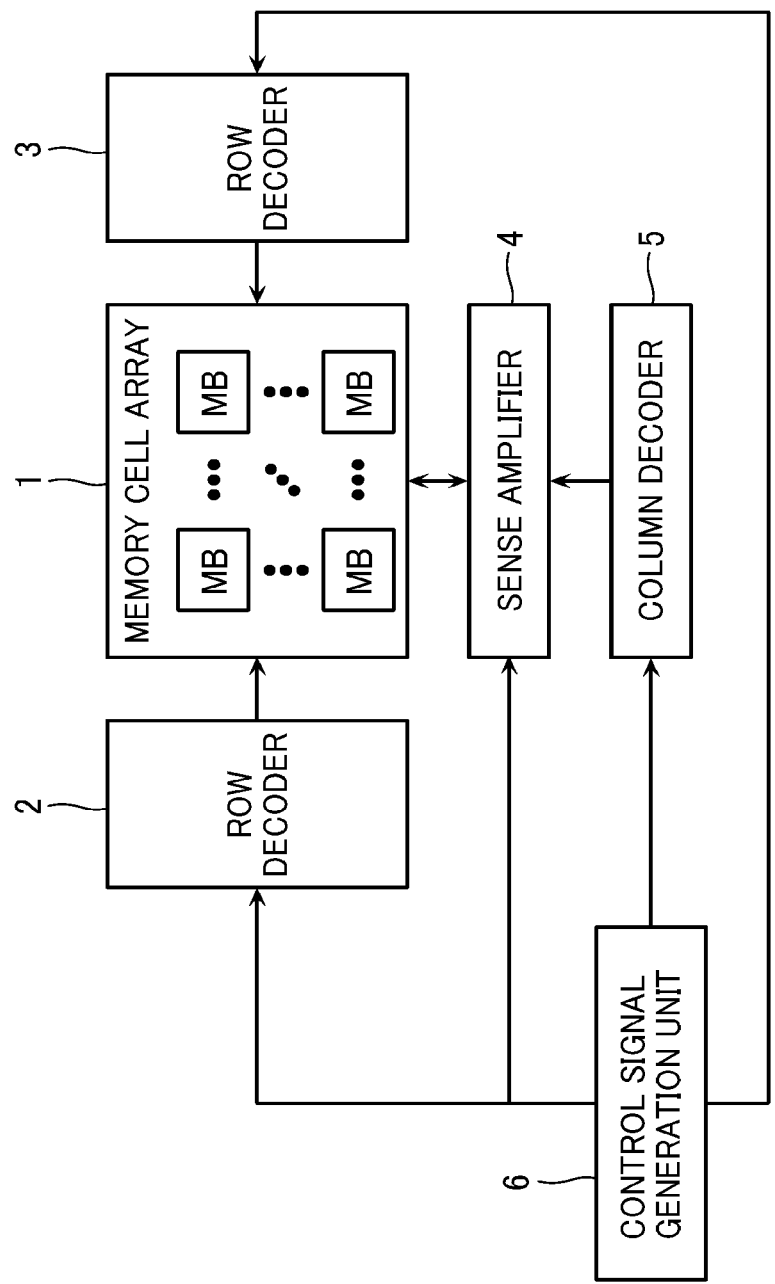
FIG. 1 is a diagram illustrating function blocks included in a semiconductor memory device according to a first embodiment.

FIG. 1 is a diagram illustrating function blocks included in a semiconductor memory device according to the present embodiment.

The semiconductor memory device according to the present embodiment includes a memory cell array 1, row decoders 2 and 3, a sense amplifier 4, a column decoder 5, and a control signal generation unit 6. The memory cell array 1 includes a plurality of memory blocks MB. Each memory block MB includes a plurality of memory cells MC arranged in a three-dimensional form, and becomes a unit of data erase operation. Each of the row decoders 2 and 3 decodes a block address signal or the like taken in, and controls a data write operation and a data read operation of the memory cell array 1. The sense amplifier 4 senses and amplifies an electric signal flowing through the memory cell array 1 at time of the read operation. The column decoder 5 decodes a column address signal, and controls the sense amplifier 4. The control signal generation unit 6 boosts a reference voltage, and generates a high voltage used at the time of the write operation or the erase operation. Besides, the control signal generation unit 6 generates a control signal, and controls the row decoders 2 and 3, the sense amplifier 4, and the column decoder 5.

The memory cell array 1 will now be described in detail.

Figure 2:
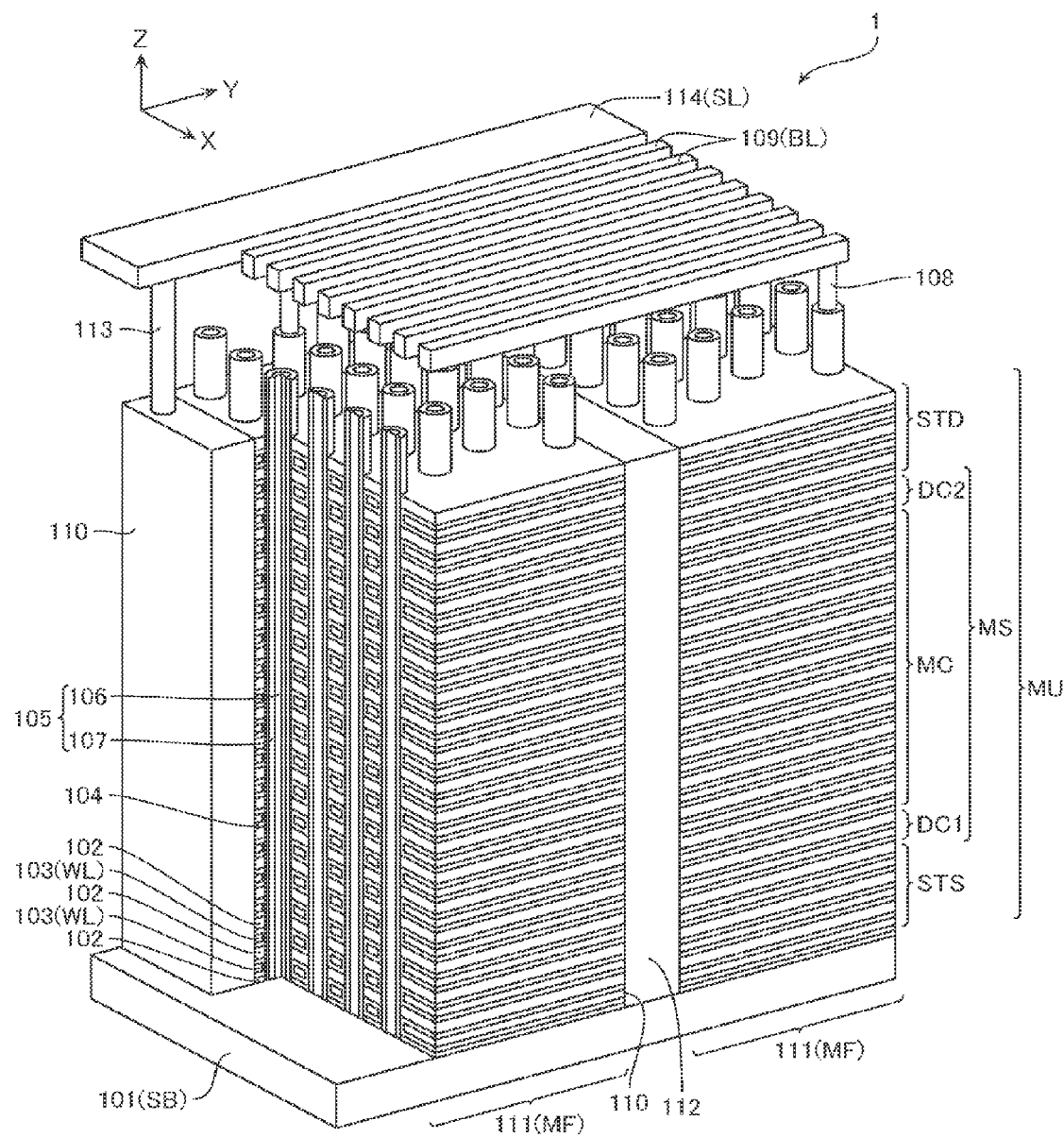
FIG. 2 is an oblique view illustrating a structure of a memory cell array included in the semiconductor memory device according to the first embodiment.

FIG. 2 is an oblique view illustrating a structure of the memory cell array included in the semiconductor memory device according to the present embodiment.

As illustrated in FIG. 2, the memory cell array 1 includes a silicon substrate SB (101), and interlayer insulation layers 102 and conductive layers 103 laminated alternately on the silicon substrate SB. Each interlayer insulation layer 102 electrically insulates upper and lower adjacent conductive layers 103 from each other. Each conductive layer 103 functions as a control gate (word line WL), a source side selection gate line SGS, or a drain side selection gate line SGD of a memory cell MC.

The conductive layer 103 can be formed of, for example, tungsten (W), tungsten nitride (WN), tungsten silicide ($WSi_x$), tantalum (Ta), tantalum nitride (TaN), tantalum silicide ($TaSi_x$), palladium silicide ($PdSi_x$), erbium silicide ($ErSi_x$), yttrium silicide ($YSi_x$), platinum silicide ($PtSi_x$), hafnium silicide ($HfSi_x$), nickel silicide ($NiSi_x$), cobalt silicide ($CoSi_x$), titanium silicide ($TiSi_x$), vanadium silicide ($VSi_x$), chromium silicide ($CrSi_x$), manganese silicide ($MnSi_x$), iron silicide ($FeSi_x$), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), copper (Cu), or a compound of them. However, the conductive layer 103 may be formed of polysilicon with an impurity added.

A multilayer film 104 including a block insulation film, a block ferroelectric film, and barrier metal is disposed around the conductive layer 103.

Furthermore, in the memory cell array 1, a plurality of memory columnar bodies 105 having a Z direction as a lengthwise direction are arranged in an X-Y direction to pass through a lamination body of the interlayer insulation layers 102 and the conductive layers 103. The memory columnar body 105 includes a semiconductor layer 106, and a memory layer 107 disposed between the semiconductor layer 106, and the interlayer insulation layer 102 and the conductive layer 103. As described later, the memory layer 107 can be formed of a lamination structure of charge storage films and insulation layers such as silicon oxide films. The memory cell MC retains data depending upon a threshold voltage changed by a charge storage quantity into the charge storage film.

The semiconductor layer 106 functions as a channel region (body) of the memory cells MC, dummy cells DC1 and DC2, a source side selection transistor STS, and a drain side selection transistor STD, which belong to a memory unit MU. A bottom end of each semiconductor layer 106 is connected to a silicon substrate SB. On the other hand, a top end of each semiconductor layer 106 is electrically connected to a bit line BL 109 via a bit line connecting line 108. The bit lines BL having a lengthwise direction in the Y direction are arranged with a predetermined pitch in the X direction.

Furthermore, a groove 110 having a depth direction in the Z direction and having a lengthwise direction in the X direction is formed in the memory cell array 1. This groove 110 divides the lamination body of the interlayer insulation layers 102 and the conductive layers 103 into sections in the Y direction. Hereafter, each of portions obtained by dividing the lamination body is referred to as "finger" sometimes. The conductive layer 103 of each finger MF 111 is electrically connected to the conductive layers 103 in several other fingers MF. As a result, several fingers MF share a word line WL. A collection of the fingers MF sharing the word line WL becomes the memory block MB, which is a minimum unit of the erase operation. Furthermore, a slit portion 112, in which an insulation layer and a conductor are formed, is disposed in the groove 110. A bottom end of the semiconductor layer 106 is electrically connected to a source line SL 114 extending in the Y direction via the silicon substrate SB, the conductor in the slit portion 112, and a source line connecting line 113. By the way, a structure of the slit portion 112 will be described later.

Figure 3:
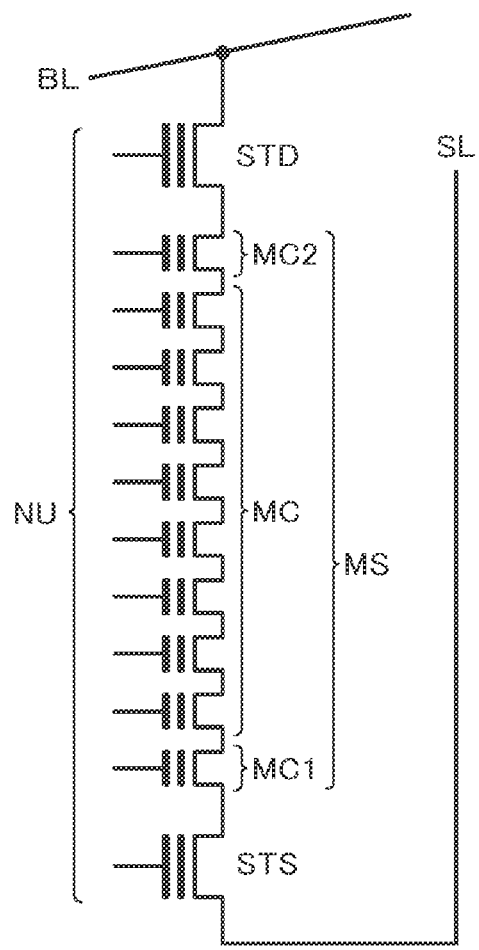
FIG. 3 is an equivalent circuit diagram of a memory unit in the memory cell array included in the semiconductor memory device according to the first embodiment.

FIG. 3 is an equivalent circuit diagram of the memory unit in the memory cell array included in the semiconductor memory device according to the present embodiment.

Each memory unit MU in the memory cell array 1 includes a memory string MS, which includes a plurality of memory cells MC and the dummy cells DC1 and DC2, the source side selection transistor STS connected between a bottom end of the memory string and the source line SL, and the drain side selection transistor STD connected between a top end of the memory string MS and the bit line BL.

Figure 4:
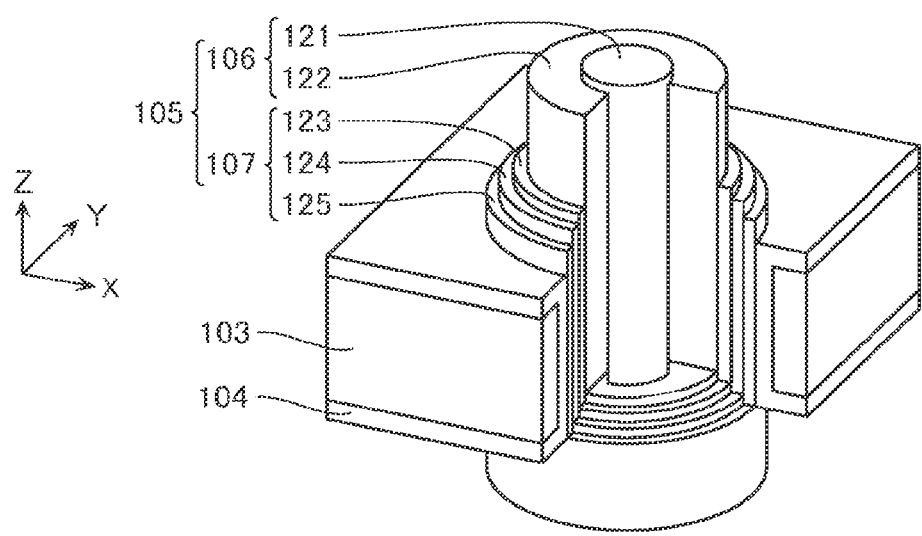
FIG. 4 is an oblique view illustrating a structure of a memory columnar body in the memory cell array included in the semiconductor memory device according to the first embodiment.

FIG. 4 is an oblique view illustrating a structure of the memory columnar body in the memory cell array included in the semiconductor memory device according to the present embodiment.

The semiconductor layer 106 in the memory columnar body 105 includes an oxide film core 121 and a semiconductor film 122 surrounding a circumference of the oxide film core 121. The oxide film core 121 can be formed of, for example, a silicon oxide film ($SiO_2$). The semiconductor film 122 can be formed of, for example, silicon (Si), silicon germanium (SiGe), silicon carbide (SiC), germanium (Ge), or carbon (C).

The memory layer 107 in the memory columnar body 105 includes a tunnel insulation film 123, a charge storage film 124, and a block insulation film 125 which surround a circumference of the semiconductor film 122. The tunnel insulation film 123 and the block insulation film 125 can be formed of, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, or AlSiO besides a silicon oxide film ($SiO_x$). The charge storage film 124 is formed of, for example, a silicon nitride film (SiN). The charge storage film 124 has a function of trapping electrons injected from the semiconductor film 122 via the tunnel insulation film 123 by a write operation. In the example illustrated in FIG. 4, the tunnel insulation film 123 and the charge storage film 124 are formed on the whole of the side surface of the semiconductor layer 106. However, this is not restrictive, but the tunnel insulation film 123 and the charge storage film 124 may be formed only in a position of a side surface of the word line WL (103).

A layout of the slit portions 112 in the memory cell array 1 will now be described.

Figure 5:
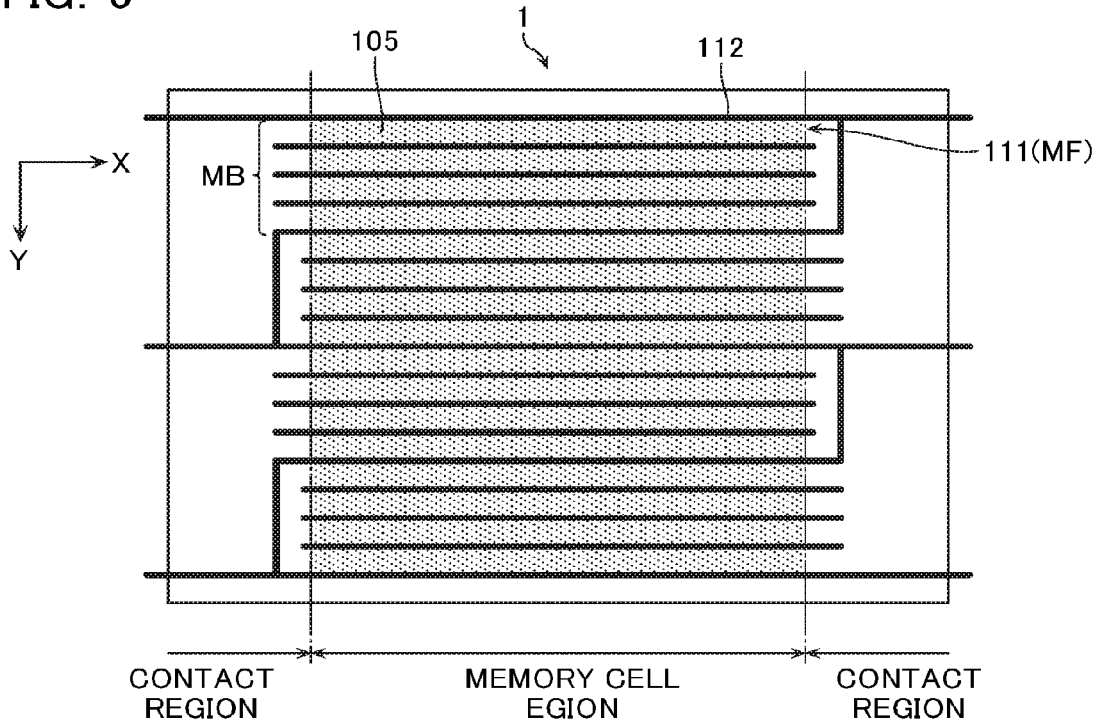
FIG. 5 is a plane view illustrating a layout of slit portions in the memory cell array included in the semiconductor memory device according to the first embodiment.
Figure 6:
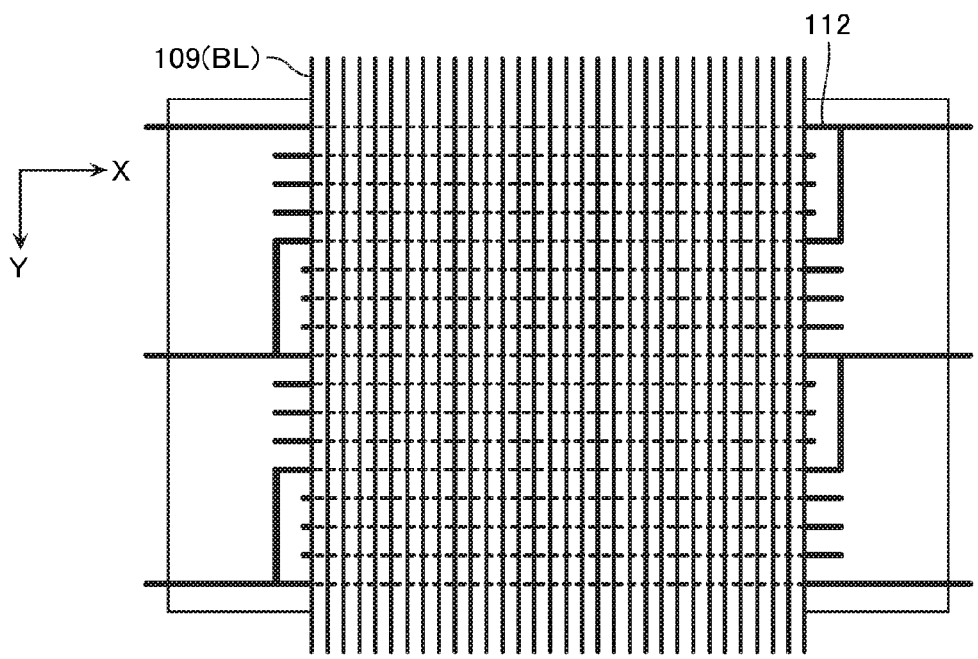
FIG. 6 is a plane view illustrating a layout of slit portions in the memory cell array included in the semiconductor memory device according to the first embodiment.

FIGS. 5 and 6 are plane views illustrating the layout of the slit portions in the memory cell array included in the semiconductor memory device according to the present embodiment. FIG. 5 is a schematic plane view of the memory cell array 1 with the bit line BL and the source line SL removed. FIG. 6 is a schematic plane view of the memory cell array 1 with the bit line BL included.

As described above, the memory cell array 1 includes a plurality of slit portions 112 arranged in the Y direction at predetermined intervals. Each slit portion 112 is formed in a memory cell region to have a depth direction in the Z direction and a lengthwise direction in the X direction. The memory cell region is a region where the memory cell MC is disposed. Furthermore, a part of a predetermined plurality of slit portions 112 are connected in a contact region by a slit portion 112 having a depth direction in the Z direction and a lengthwise direction in the Y direction. The contact region is a region around the memory cell region. The contact region is a region where connection lines, which electrically connect the bit line BL or the word line WL to peripheral circuits on the silicon substrate 101, are disposed. A portion between adjacent slit portions 112 in the memory cell region becomes the finger MF including a plurality of memory columnar bodies 105 disposed in the X-Y direction. By the way, in a case of FIG. 5, a plurality of memory blocks MB are disposed with boundaries specified to be slit portions 112 extending in the X direction to which slit portions 112 having a lengthwise direction as the Y direction are connected. In other words, in the case of FIG. 5, four fingers MF are included in the memory block MB.

A structure of the slit portion 112 in the memory cell array 1 will now be described.

First, a structure of a slit portion according to a comparative example for the present embodiment will now be described as a premise for description of the slit portion 112 according to the present embodiment.

Figure 7:
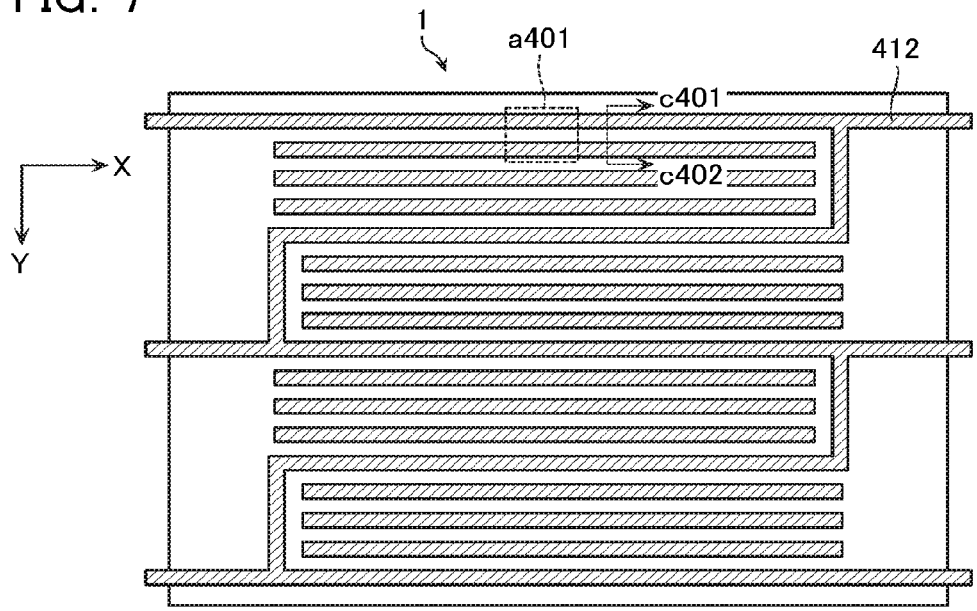
FIG. 7 is a plane view illustrating a layout of slit portions in a memory cell array included in a semiconductor memory device according to a first comparative example for the first embodiment.
Figure 8:
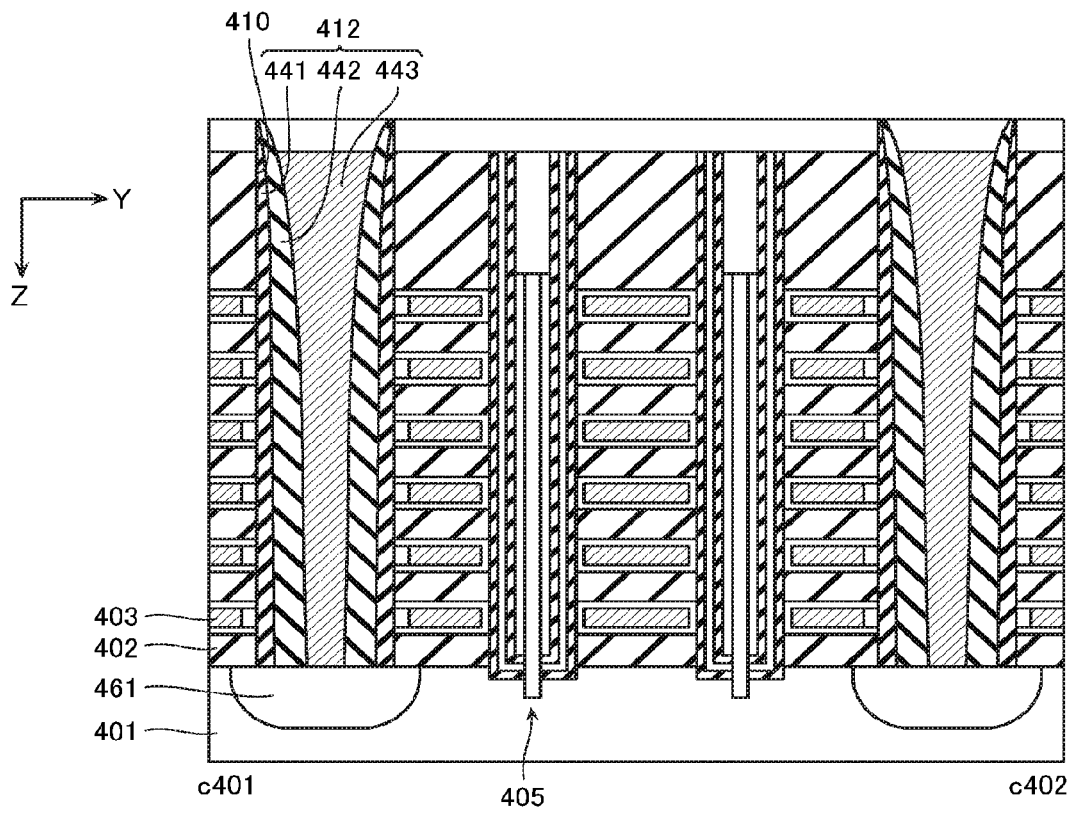
FIG. 8 is a sectional view around the slit portion in the memory cell array included in the semiconductor memory device according to the comparative example.
Figure 9:
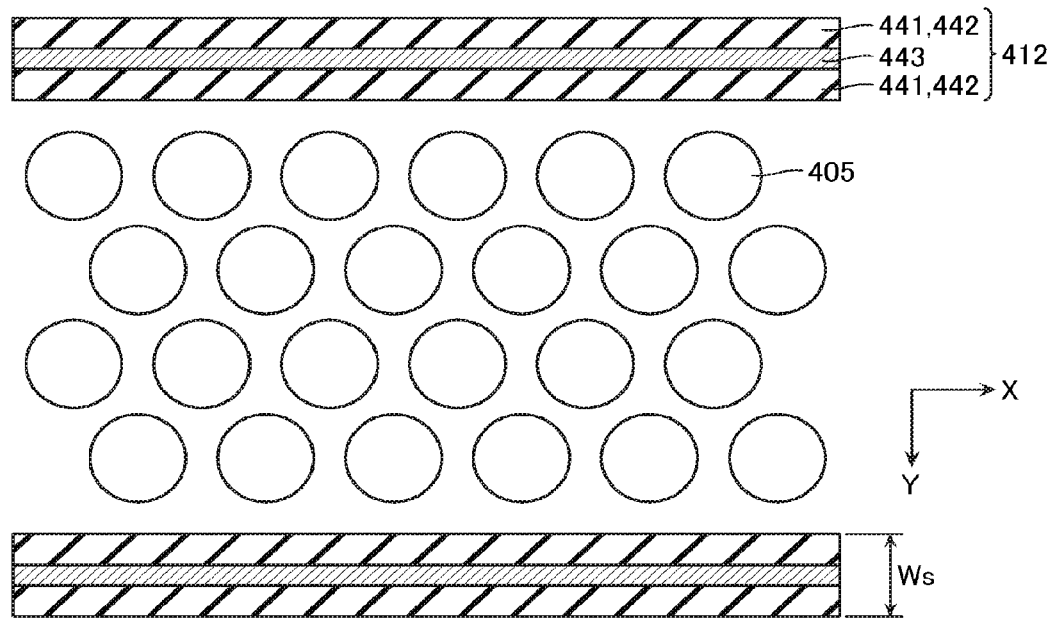
FIG. 9 is a plane view illustrating a layout around the slit portions in the memory cell array included in the semiconductor memory device according to the comparative example.

FIG. 7 is a plane view illustrating a layout of the slit portions included in the semiconductor memory device according to a first comparative example for the present embodiment. FIG. 8 is a sectional view around the slit portions included in the semiconductor memory device. FIG. 8 is a sectional view taken along a line c401-c402 in FIG. 7. Two slit portions 412 adjacent in the Y direction and two memory columnar bodies 405 disposed between these two slit portions 412 are illustrated. FIG. 9 is a plane view illustrating a layout around the slit portions in the semiconductor memory device. FIG. 9 is a diagram obtained by enlarging a region indicated by a dashed line a401 in FIG. 7.

In the slit portion 412, a first insulation film 441, a second insulation film 442, and a conductor 443 are disposed from side surfaces of the groove 410 toward inside of the groove 410 as illustrated in FIG. 8. The conductor 443 can be formed of titanium (Ti), titanium nitride (TiN), or the like besides tungsten (W). Below a surface of a silicon substrate 401, an impurity diffusion region 461 is disposed along the slit portion 412. The impurity diffusion region 461 is in contact with the conductor 443. As a result, the surface of the silicon substrate 401 is supplied with potential on the source line SL. In FIG. 7, in the slit portion 412, places where the conductor 443 is buried are indicated by oblique lines.

The slit portion has three functions: (1) dividing the laminated word line WL into sections, (2) electrically connecting the surface (impurity diffusion region) of the silicon substrate SB to the source line SL to make them the same in potential, and (3) local wiring. In the first comparative example, the conductor 443 is buried in the whole in the lengthwise direction of the slit portion 412 as illustrated in FIG. 8 to have the functions (2) and (3).

In the case of the first comparative example, however, the following problems occur. That is, if the conductor 443 made of a material such as tungsten is heated in a production process of the memory cell array 1, the conductor 443 shrinks. And an influence thereof appears most in the X direction, which is the main lengthwise direction of the slit portion 412. As a result, the silicon substrate 401 curves in the X direction to become upper in both ends and become lower in the center, and curves in the Y direction to become lower in both ends and become upper in the center. In other words, the whole of the silicon substrate 401 distorts in a potato chip form. As a result, problems such as alignment deviation of lithography become apt to occur in the production process of the semiconductor memory device. Furthermore, a width Ws (a length in the Y direction) of the slit portion 412 becomes wide to some degree as illustrated in FIG. 9 because the conductor 443 is disposed. Accordingly, a point that the chip size also becomes large poses a problem.

Therefore, a slit portion having a structure described below to solve the above-described problems will be considered.

Figure 10:
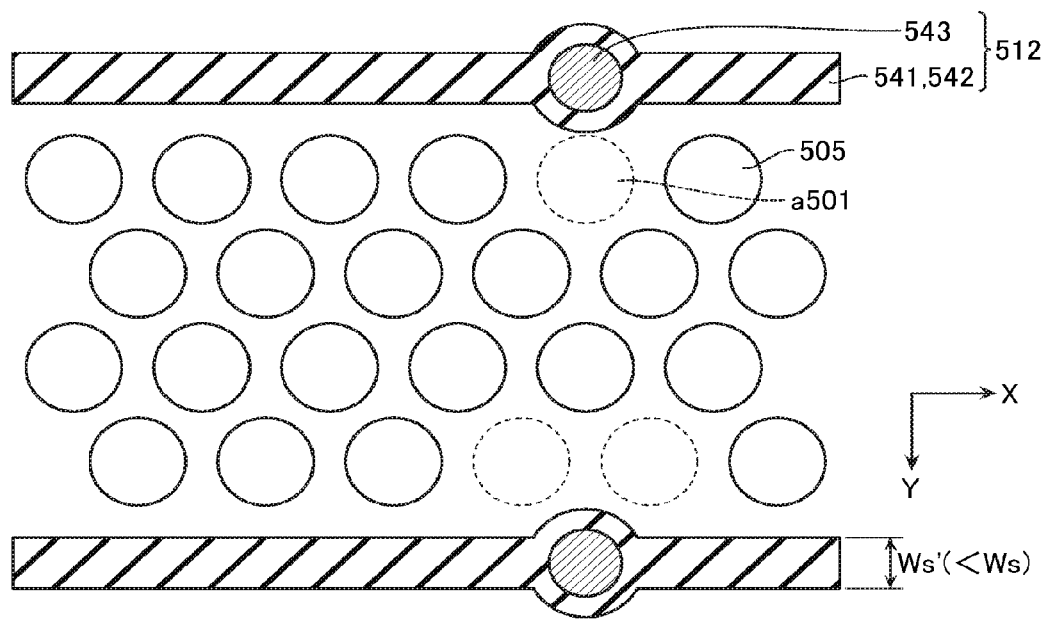
FIG. 10 is a plane view illustrating a layout around slit portions in a memory cell array included in a semiconductor memory device according to a second comparative example for the first embodiment.

FIG. 10 is a plane view illustrating a layout around the slit portions included in a semiconductor memory device according to a second comparative example for the present embodiment.

In the case of the second comparative example, a conductor 543 is buried not in the whole in the lengthwise direction (the X direction or the Y direction) in a slit portion 512, but only in predetermined places discretely. According to the second comparative example, therefore, distortion of the silicon substrate caused by shrinking of the conductor 543 can be reduced. In addition, in a place where the conductor 543 is not buried in the slit portion 512, a width Ws' (a length in the Y direction) of the slit portion 512 can be made narrower as compared with the case of the first embodiment.

On the other hand, however, an interval between adjacent slit portions 412 becomes narrow in the place where the conductor 543 is buried. As indicated by a dashed line a501 in FIG. 10, therefore, it is necessary to remove a portion of memory columnar bodies 505. As a result, not only the number of memory cells MC decreases, but also the periodicity of the layout of the memory columnar bodies 505 is disturbed. In addition, in places where the conductor 543 is not buried, the impurity diffusion region in the silicon substrate is made to bear the above-described function (3). Inevitably, therefore, the wiring resistance of the local wiring becomes large, and the performance of the semiconductor memory device becomes lower. If the number of the conductors 543 is increased to dissolve the problem, the effect of the shrinking of the chip size necessarily becomes small.

In the present embodiment, therefore, the above-described problems are dissolved by using the slit portion 112 having a structure described below. Hereafter, points in which the present embodiment differs from the first and second comparative examples will be mainly described.

Figure 11:
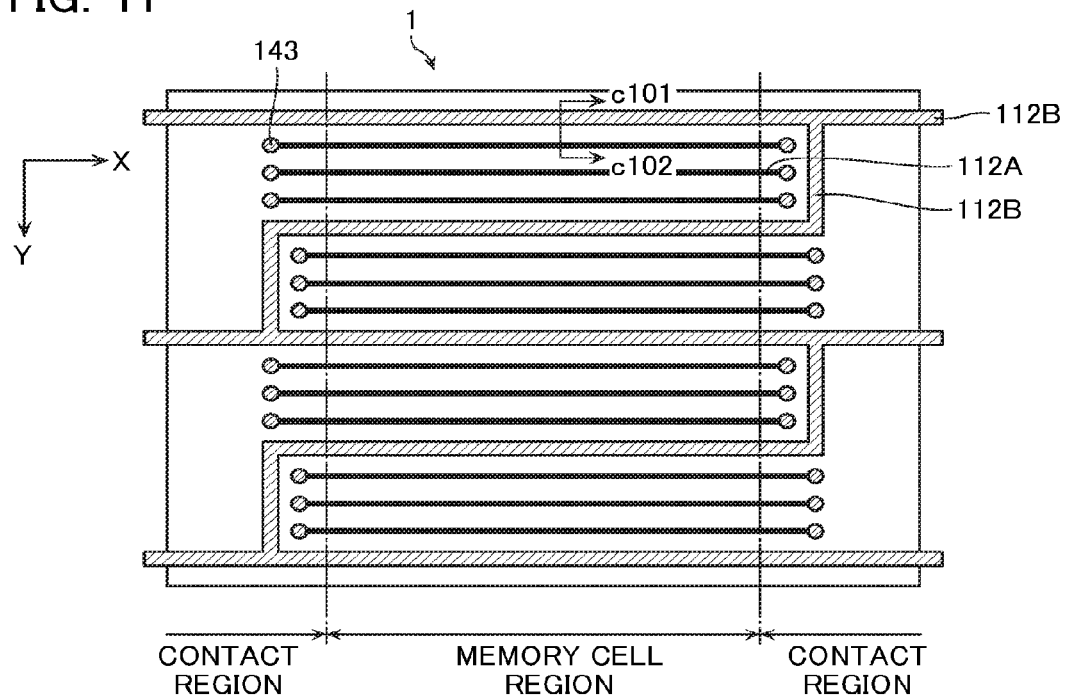
FIG. 11 is a plane view illustrating a layout of the slit portions in the memory cell array included in the semiconductor memory device according to the first embodiment.
Figure 12:
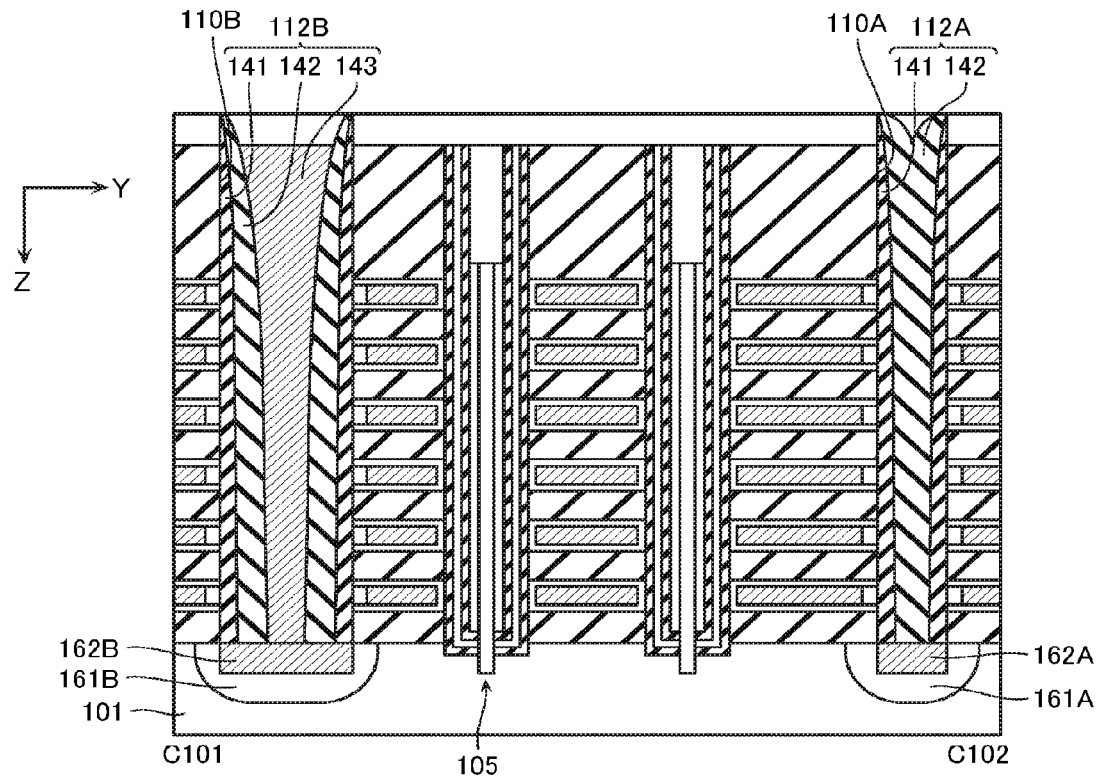
FIG. 12 is a sectional view around the slit portion in the memory cell array included in the semiconductor memory device according to the first embodiment.

FIG. 11 is a plane view illustrating a layout of slit portions in a memory cell array included in a semiconductor memory device according to the present embodiment. In FIG. 11, places in the slit portions 112 where the conductors 143 are buried are indicated by oblique lines. FIG. 12 is a sectional view around the slit portions in the memory cell array included in the semiconductor memory device. FIG. 12 is a sectional view taken along a c101-c102 line.

The memory cell array 1 in the present embodiment includes two kinds of slit portions, 112A and 112B as the slit portions 112. As illustrated in FIG. 11, the slit portion 112A has a structure in which the conductor 143 having a length at least in the X direction shorter than a groove 110A is buried at both ends located outside the memory cell region. In other words, in an intermediate portion of the slit portion 112A, only a first insulation film 141 and a second insulation film 142 are disposed from a side wall of the groove 110A toward inside thereof as illustrated in FIG. 12. On the other hand, in the slit portion 112B, the first insulation film 141, the second insulation film 142, and the conductor 143 are disposed from a side wall of a groove 110E toward inside thereof in the whole in the lengthwise direction (the X direction) of the slit portion 112B in the same way as the slit portion 412 in the first comparative example. Each of end portions of the slit portion 112A has a section similar to that of the slit portion 112B illustrated in FIG. 12. In other words, the groove 110A forming the slit portion 112A has different widths (lengths in the Y direction) in the vicinity of the end portions and other intermediate portions.

In the concrete example illustrated in FIGS. 11 and 12, two kinds of slit portions, 112A and 112B are mixedly present in the memory cell array 1. In the present embodiment, however, only the slit portions 112A may be used. Furthermore, in the concrete example illustrated in FIGS. 11 and 12, the conductor 143 is buried at both ends of the slit portion 112A. In the present embodiment, however, the conductor 143 may be embedded in one of the ends of the slit portion 112A.

Figure 13:
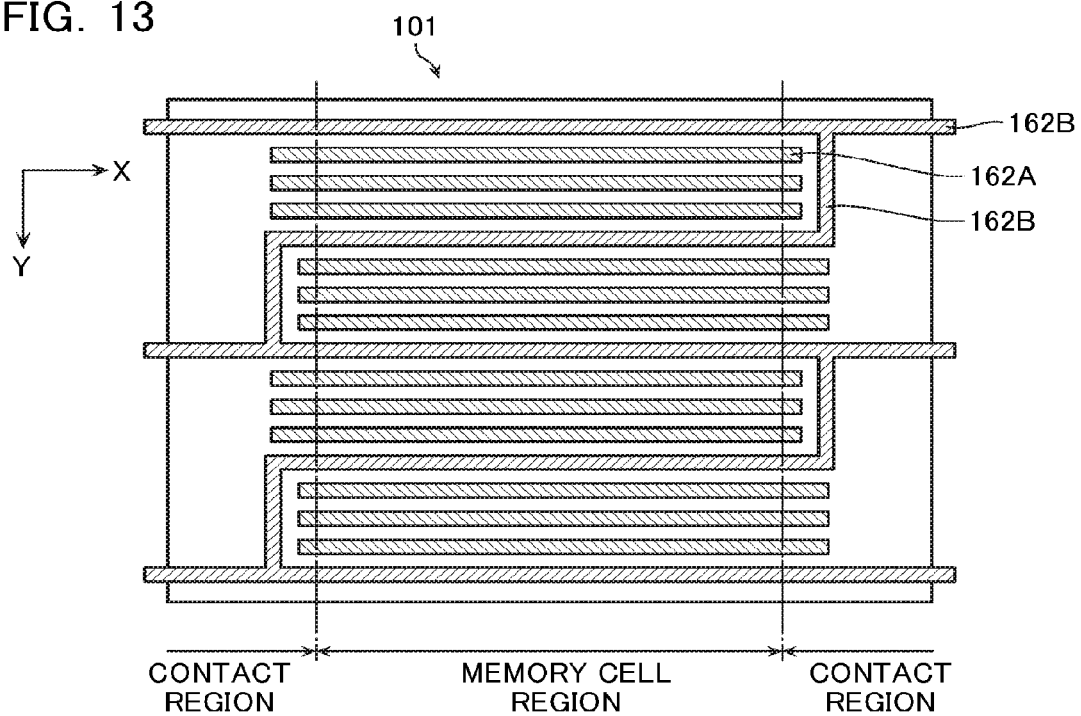
FIG. 13 is a plane view illustrating a layout of a silicide film below a surface of a silicon substrate included in the semiconductor memory device according to the first embodiment.

Furthermore, the silicon substrate 101 in the present embodiment includes an impurity diffusion region 161 disposed along the slit portion 112 below a surface of the silicon substrate 101 in the same way as the first comparative example. Unlike the first comparative example, however, a silicide film 162 in contact with the conductor 143 is disposed in each of these impurity diffusion regions 161. The silicide film 162 can be formed of low resistance metal silicide of, for example, cobalt silicide, nickel silicide or the like. In FIG. 12 and FIG. 13 which will be described below, an impurity diffusion region disposed along the slit portion 112A is denoted by 161A, a silicide film disposed in the impurity diffusion region 161A is denoted by 162A, an impurity diffusion region disposed along the slit portion 112B is denoted by 161B, and a silicide film disposed in the impurity diffusion region 161B is denoted by 162B.

FIG. 13 is a plane view of the silicide film below the surface of the silicon substrate included in the semiconductor memory device according to the present embodiment.

As illustrated in FIG. 13, the silicide film 162 is disposed below the surface of the silicon substrate 101 in the whole in the lengthwise direction (the X direction or the Y direction) of the slit portion 112. As a result, the surface of the silicon substrate 101 is supplied with the potential on the source line SL via the conductor 143.

In the case of the present embodiment, at least a part of the slit portion 112 is set to be a slit portion 112A having no conductors 143 in the intermediate portion. As a result, the shrinking quantity of the conductor 143 caused by heating becomes smaller. As compared with the first comparative example, therefore, distortion of the silicon substrate 101 can be reduced. Furthermore, in the case of the present embodiment, the size of the whole slit portion 112 becomes smaller by using the slit portion 112A having no conductors 143 in the intermediate portion. As compared with the first comparative example, therefore, the chip size can be reduced. Furthermore, in the case of the present embodiment, the conductor 143 is disposed outside the memory cell region as in ends of the slit portion 112. Unlike the second comparative example, therefore, the periodicity in the layout of the memory columnar bodies 105 is not disturbed. In addition, in the case of the present embodiment, the silicide film 162 is disposed below the surface of the silicon substrate 101. As compared with the second comparative example, therefore, the wiring resistance of the local wiring can be made small. By the way, as for the silicide film 162A along the slit portion 112A, this effect can be obtained if the silicide film 162A is made longer than the conductor 143 in the slit portion 112A at least in the lengthwise direction (X direction) of the slit portion 112A.

According to the present embodiment, it is possible to provide a semiconductor memory device that implements a lower cost brought about by shrinking of the chip size and higher performance brought about by resistance reduction of the local wiring as described heretofore.

Second Embodiment

In the first embodiment, the example in which the conductor 143 is disposed at both ends of the slit portion 112A has been described. In a second embodiment, however, an example in which there is no conductor 143 in the slit portion 112 itself will be described. Here, points differing from the first embodiment will be mainly described.

Figure 14:
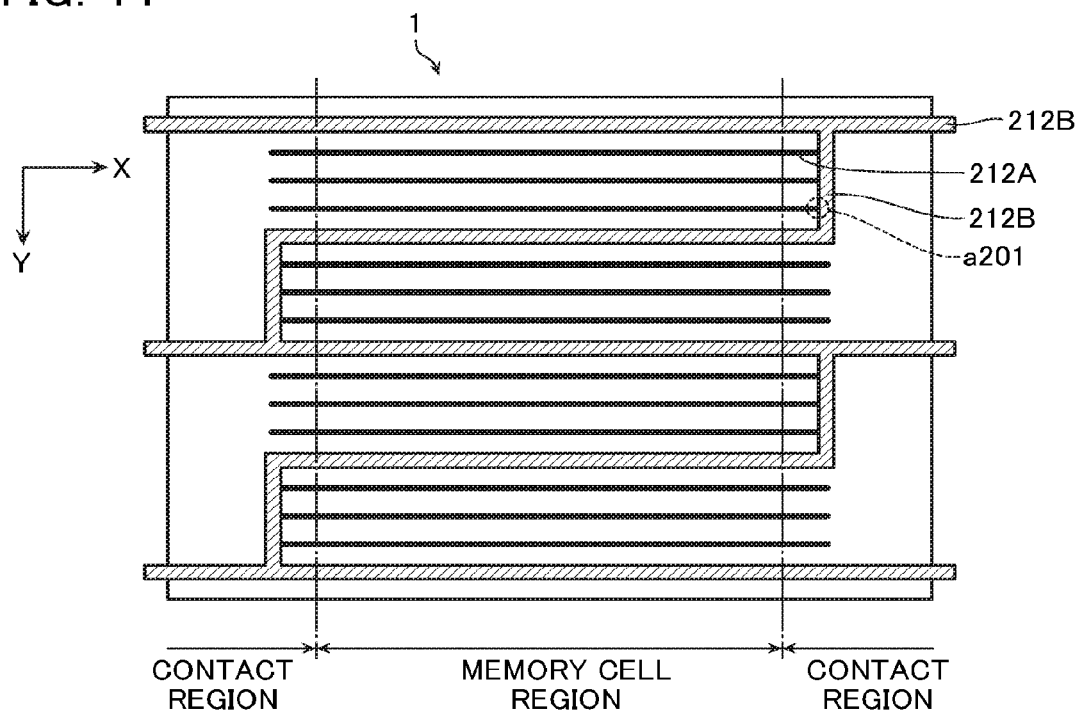
FIG. 14 is a plane view illustrating a layout of slit portions in a memory cell array included in a semiconductor memory device according to a second embodiment.
Figure 15:
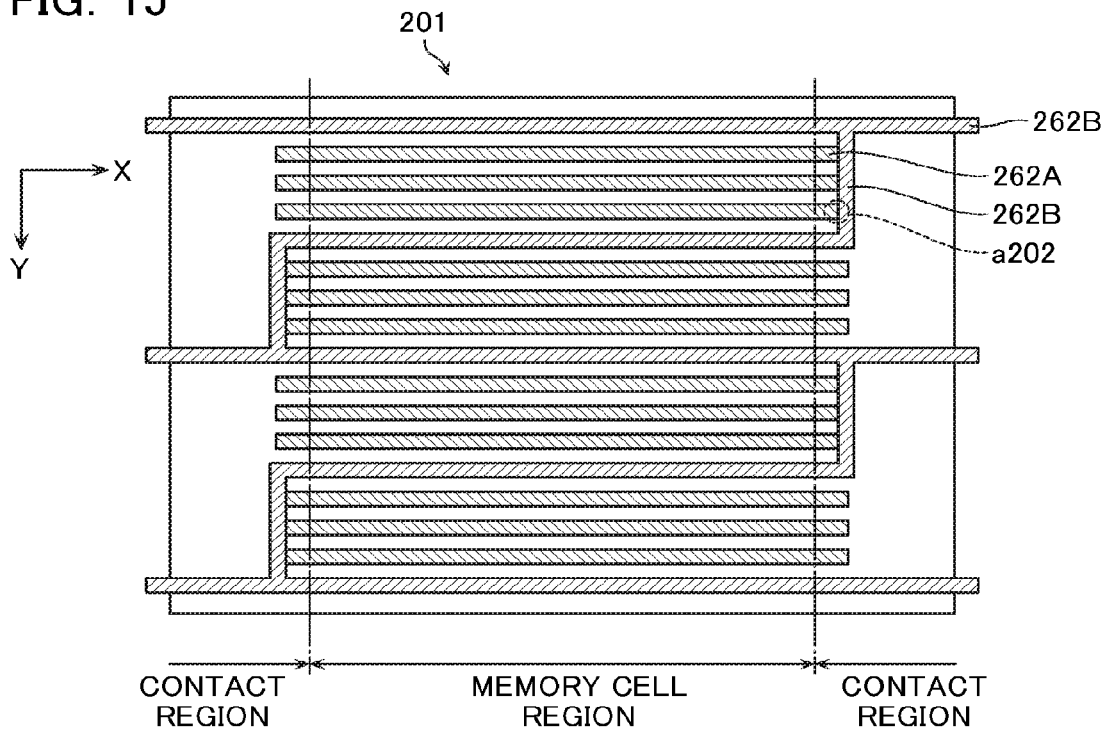
FIG. 15 is a plane view illustrating a layout of a silicide film below a surface of a silicon substrate included in the semiconductor memory device according to the second embodiment.

FIG. 14 is a plane view illustrating a layout of the slip portion included in the semiconductor memory device according to a second embodiment. In FIG. 14, places in the slit portion 212 where a conductor 243 (which is not illustrated and which has a structure similar to that of the conductor 143) is buried are indicated by oblique lines. FIG. 15 is a plane view illustrating a layout of the silicide film below the surface of the silicon substrate.

The memory cell array 1 in the present embodiment includes two kinds of slit portions 212A and 212B as the slit portions 212 in the same way as the first embodiment. As illustrated in FIG. 14, the slit portion 212A has a structure in which the conductor 243 is not buried in the whole in the lengthwise direction (X direction). The section of the slit portion 212A is similar to that of the slit portion 112A illustrated in FIG. 12. On the other hand, as illustrated in FIG. 14, the slit portion 212B has a structure in which the conductor 243 is buried in the whole in the lengthwise direction (X direction or Y direction). The section of the slit portion 212B is similar to that of the slit portion 112B illustrated in FIG. 12. The slit portion 212A is connected at an end thereof to the slit portion 212B having a lengthwise direction in the Y direction as indicated by a dashed line a201 in FIG. 14. As described heretofore, there is a difference in structure between the slit portion 212A and the slit portion 212B. As a result, a groove 210A forming the slit portion 212A has a width (a length in the Y direction) narrower than that of a groove 210B forming the slit portion 212B. The groove 210A is not illustrated and has a structure similar to that of the groove 110A. The groove 210B is not illustrated and has a structure similar to that of the groove 110B.

Furthermore, a silicon substrate 201 in the present embodiment has an impurity diffusion region in the same way as the first embodiment.

Furthermore, the silicon substrate 201 includes a silicide film 262A disposed along the slit portion 212A and a silicide film 262B disposed along the slit portion 212B, on the impurity diffusion region. The conductor 243 disposed in the groove 210B with the slit portion 212B formed therein is in contact with the source line SL at an upper portion thereof and is in contact with the silicide film 262B at a lower portion thereof. As a result, the silicide film 262B is electrically connected to the source line SL. As indicated by a dashed line a202 in FIG. 15, the silicide film 262A is, at an end thereof, in contact with the silicide film 262B in a T-letter form. Although the slit portion 212A itself does not include the conductor 243, therefore, the silicide film 262A is electrically connected to the source line SL.

According to the present embodiment, the silicide film 262A is brought into contact with the silicide film 262B. As a result, effects similar to those in the first embodiment can be obtained without disposing the conductor 243 in the slit portion 212A itself.

Third Embodiment

In a third embodiment, a modification of the second embodiment will be described. Here, points differing from the second embodiment will be mainly described.

Figure 16:
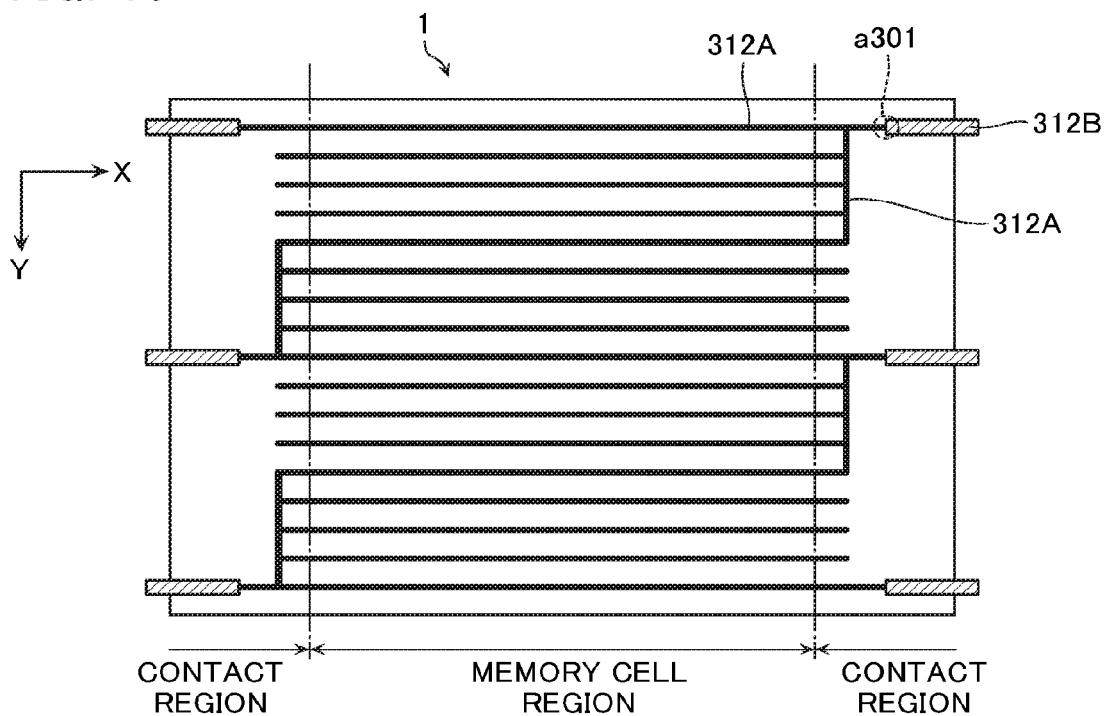
FIG. 16 is a plane view illustrating a layout of slit portions in a memory cell array included in a semiconductor memory device according to a third embodiment.
Figure 17:
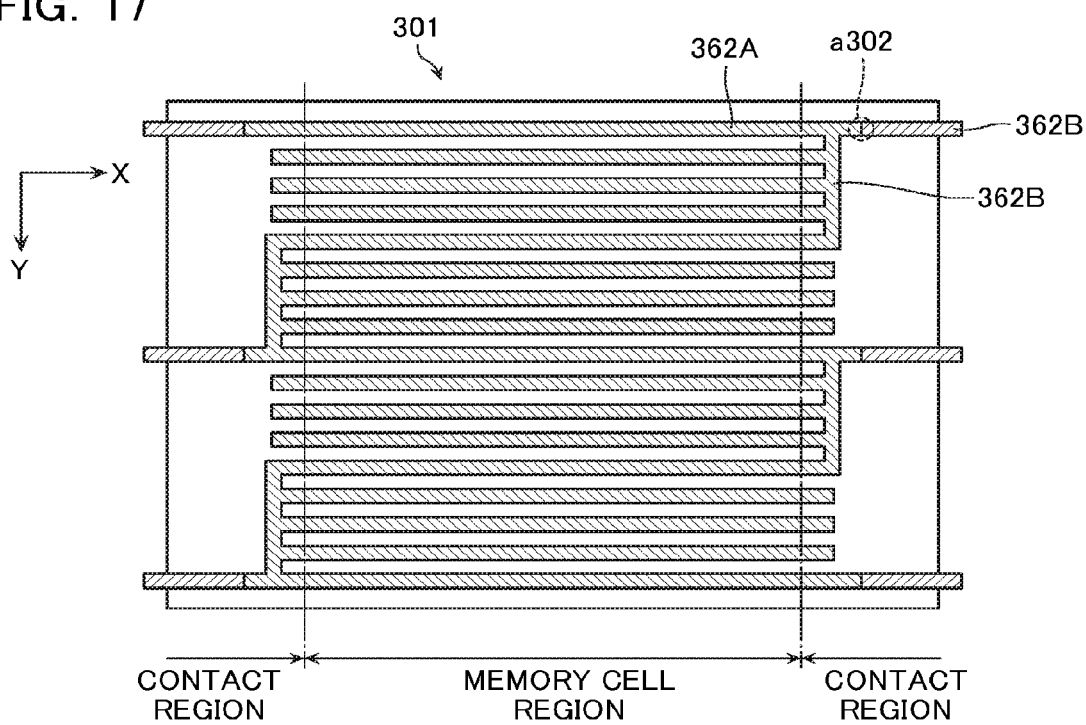
FIG. 17 is a plane view illustrating a layout of a silicide film below a surface of a silicon substrate included in the semiconductor memory device according to the third embodiment.

FIG. 16 is a plane view illustrating a layout of slit portions included in the semiconductor memory device according to the third embodiment. In FIG. 16, places in slit portions 312 where a conductor 343 (which is not illustrated and which has a structure similar to that of the conductor 143) is buried are indicated by oblique lines. FIG. 17 is a plane view illustrating a layout of a silicide film below the surface of the silicon substrate.

The memory cell array 1 in the present embodiment includes slit portions 312A and 312B respectively having structures similar to those of the slit portions 212A and 212B in the second embodiment. Furthermore, a silicon substrate 301 includes silicide films 362A and 362B respectively having structures similar to those of the silicide films 262A and 262B in the second embodiment.

In the case of the present embodiment, however, the slit portion 312B having the conductor 343 is disposed in the contact region located outside the memory cell region. Furthermore, as indicated by a dashed line a301 in FIG. 16, the slit portion 312A is connected at an end thereof to the slit portion 312B in a straight line form. As indicated by a dashed line a302 in FIG. 17, the silicide film 362A is in contact, at an end thereof, with the silicide film 362B in a straight line form. Although there is not a conductor in the slit portion 312A itself, therefore, the silicide film 362A is electrically connected to the source line SL.

According to the present embodiment, effects similar to those in the first embodiment can be obtained even in a case where the shape of the connection portion between the slit portions or the contact portion between the silicide films is different from that in the case of the second embodiment because of specifications of the semiconductor memory device.

Fourth Embodiment

A production method of a semiconductor memory device including a mixture of slit portions having no conductors and slit portions having conductors as in the first to third embodiments will now be described.

FIGS. 18 to 25 are sectional views illustrating a production process around the slit portions included in a semiconductor memory device according to a fourth embodiment.

Figure 18:
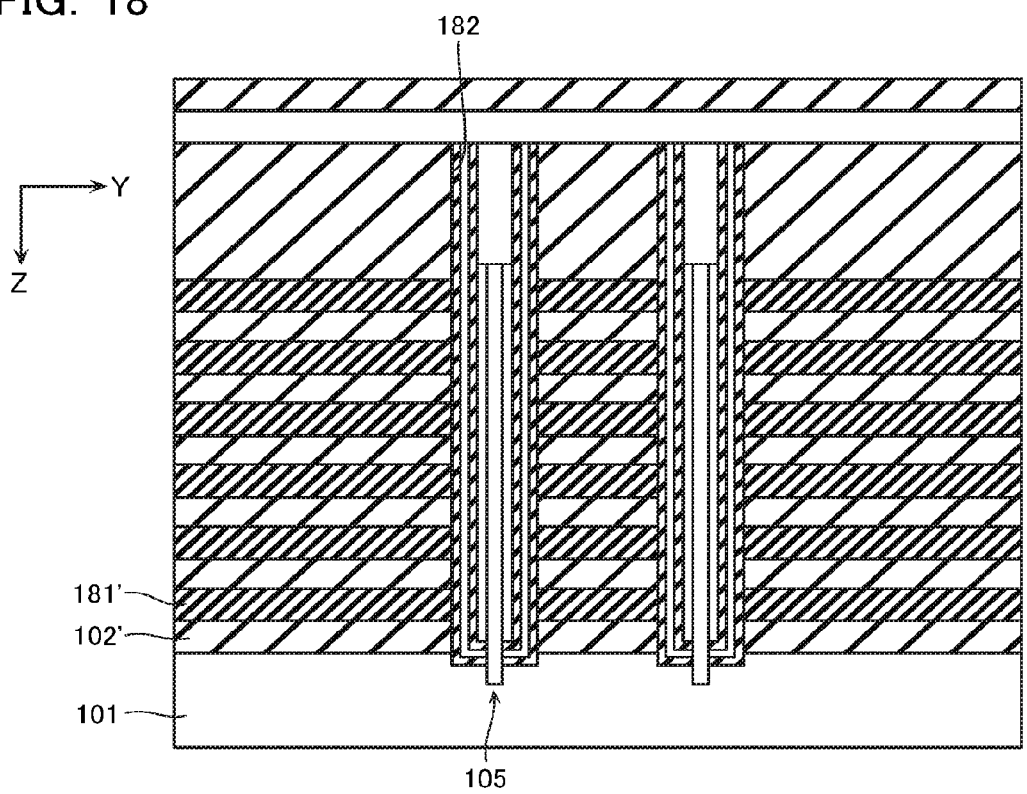
FIG. 18 is a sectional view illustrating a production process around a slit portion in a memory cell array included in a semiconductor memory device according to a fourth embodiment.

First, as illustrated in FIG. 18, an interlayer insulation layer 102" and a sacrifice layer 181" are laminated alternately a plurality of times on the silicon substrate 101 having a surface along the X-Y direction as a main surface. The interlayer insulation layer 102" can be formed of, for example, silicon oxide ($SiO_2$). The sacrifice layer 181" can be formed of, for example, silicon nitride (SiN). Subsequently, a memory hole 182 having a lengthwise direction in the Z direction is formed through the interlayer insulation layer 102" and the sacrifice layer 181" by anisotropic etching. As a result, an interlayer insulation layer 102' and a sacrifice layer 181' are formed. Subsequently, the memory columnar body 105 having a memory material including the semiconductor layer 106 is formed in the memory hole 182.

Figure 19:
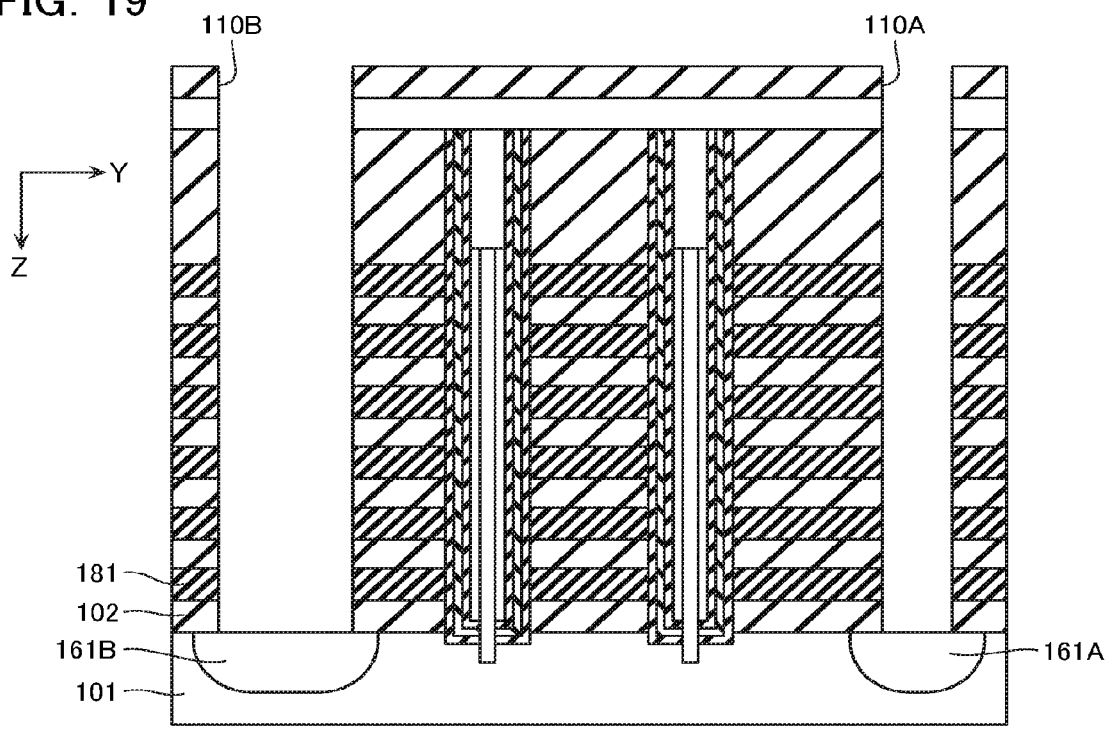
FIG. 19 is a sectional view illustrating a production process around the slit portion in the memory cell array included in the semiconductor memory device according to the fourth embodiment.

Subsequently, as illustrated in FIG. 19, a groove 110A having a depth direction in the Z direction and a groove 110B having a wider width as compared with the groove 110A are formed through the interlayer insulation layer 102' and the sacrifice layer 181' by anisotropic etching. As a result, an interlayer insulation layer 102 and a sacrifice layer 181 are formed. Subsequently, the surface of the silicon substrate 101 appearing on bottom portions of the grooves 110A and 110B is doped with impurities to form the impurity diffusion regions 161A and 161B.

Figure 20:
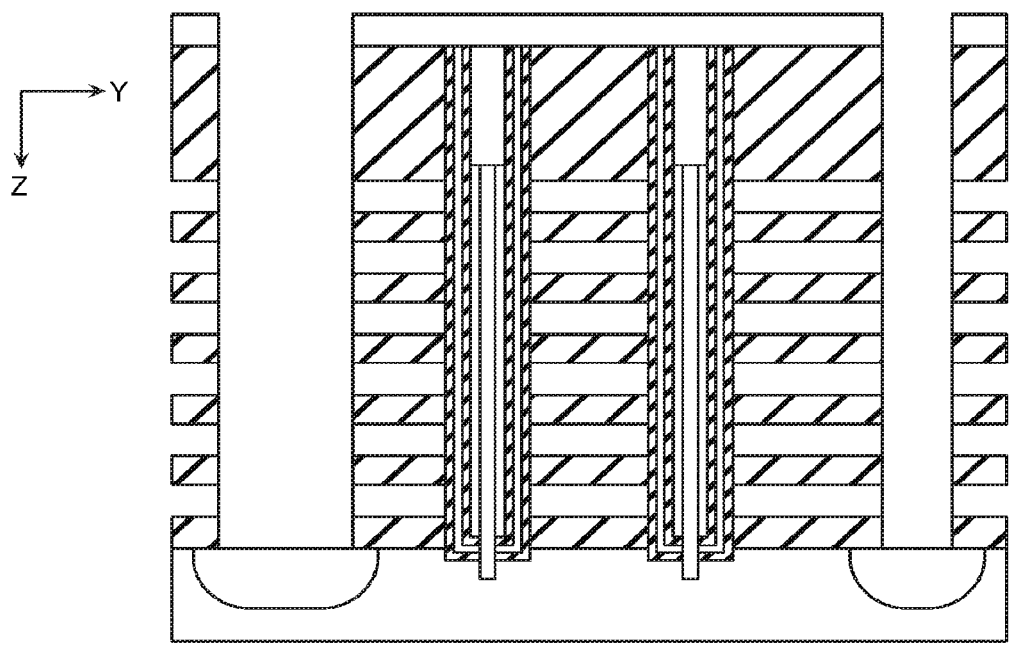
FIG. 20 is a sectional view illustrating a production process around the slit portion in the memory cell array included in the semiconductor memory device according to the fourth embodiment.

Subsequently, as illustrated in FIG. 20, the sacrifice layer 181 is removed. The removal of the sacrifice layer 181 is conducted by wet etching using, for example, a phosphoric acid solution.

Figure 21:
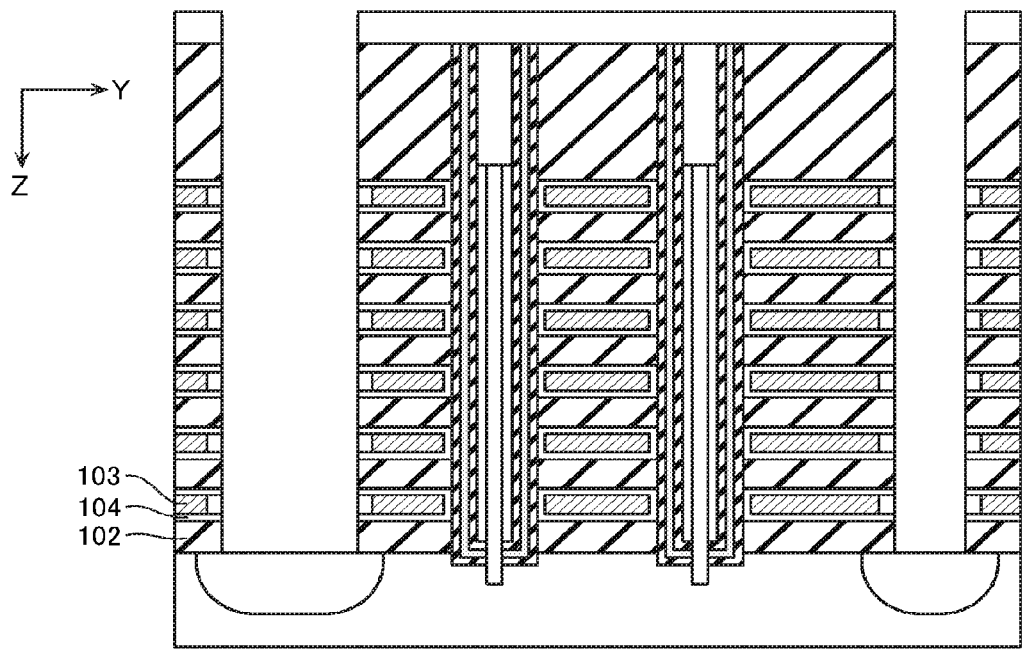
FIG. 21 is a sectional view illustrating a production process around the slit portion in the memory cell array included in the semiconductor memory device according to the fourth embodiment.

Subsequently, as illustrated in FIG. 21, a multilayer film 104 is formed on a side surface of the interlayer insulation layer 102, which appears because of the removal of the sacrifice layer 181. Subsequently, the conductive layer 103 is formed on a side surface of the multilayer film 104. The conductive layer 103 can be formed of, for example, tungsten (W) as described above. This conductive layer 103 becomes the word line WL.

Figure 22:
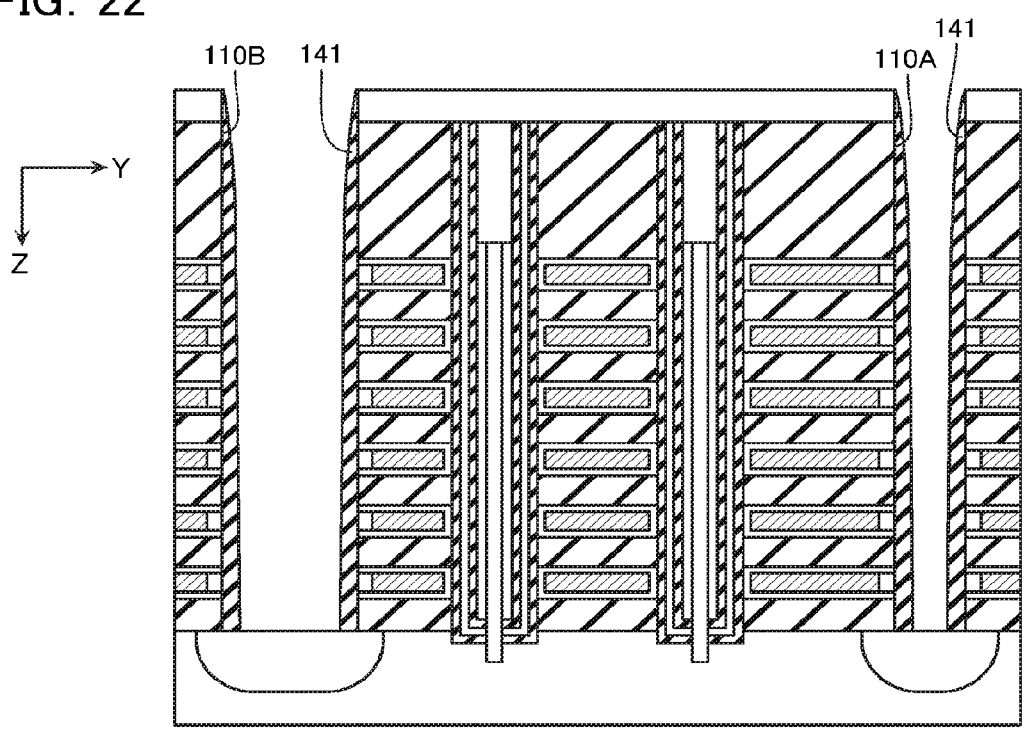
FIG. 22 is a sectional view illustrating a production process around the slit portion in the memory cell array included in the semiconductor memory device according to the fourth embodiment.

Subsequently, as illustrated in FIG. 22, the first insulation film 141 is formed on side walls of the grooves 110A and 110B to such a degree that the grooves 110A and 110B are not blocked up.

Figure 23:
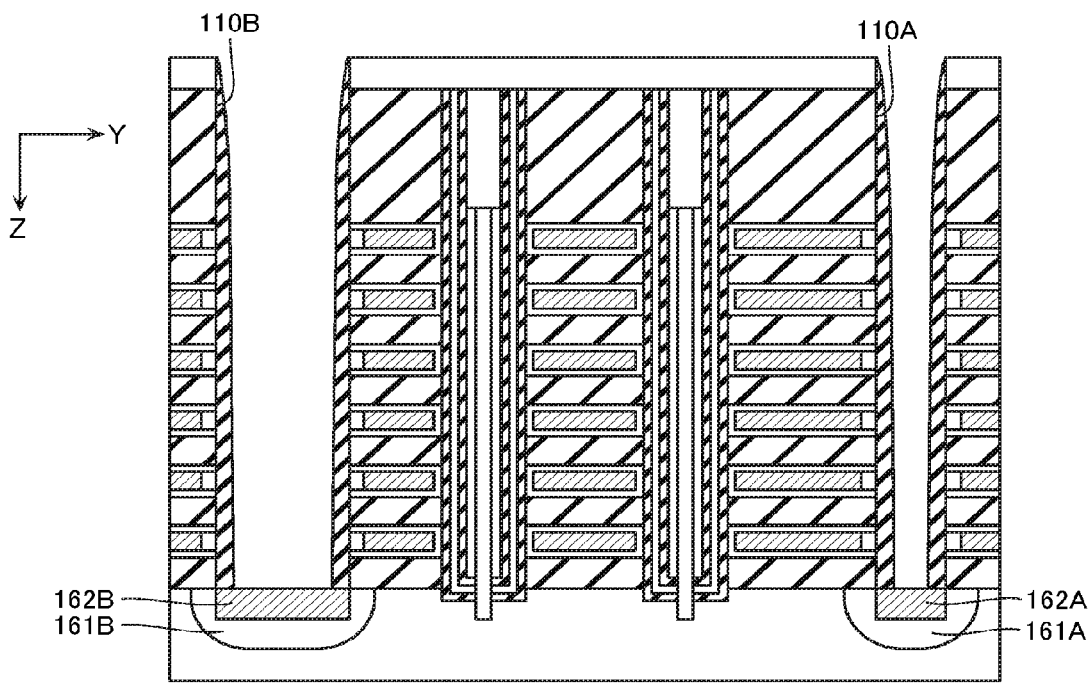
FIG. 23 is a sectional view illustrating a production process around the slit portion in the memory cell array included in the semiconductor memory device according to the fourth embodiment.

Subsequently, as illustrated in FIG. 23, the silicide films 162A and 162B are formed on surfaces of the impurity diffusion regions 161A and 161B, which appear on bottom surfaces of the grooves 110A and 110B, respectively by using a silicide process. The silicide films 162A and 162B can be formed of, for example, cobalt silicide ($CoSi_x$) as described above.

Figure 24:
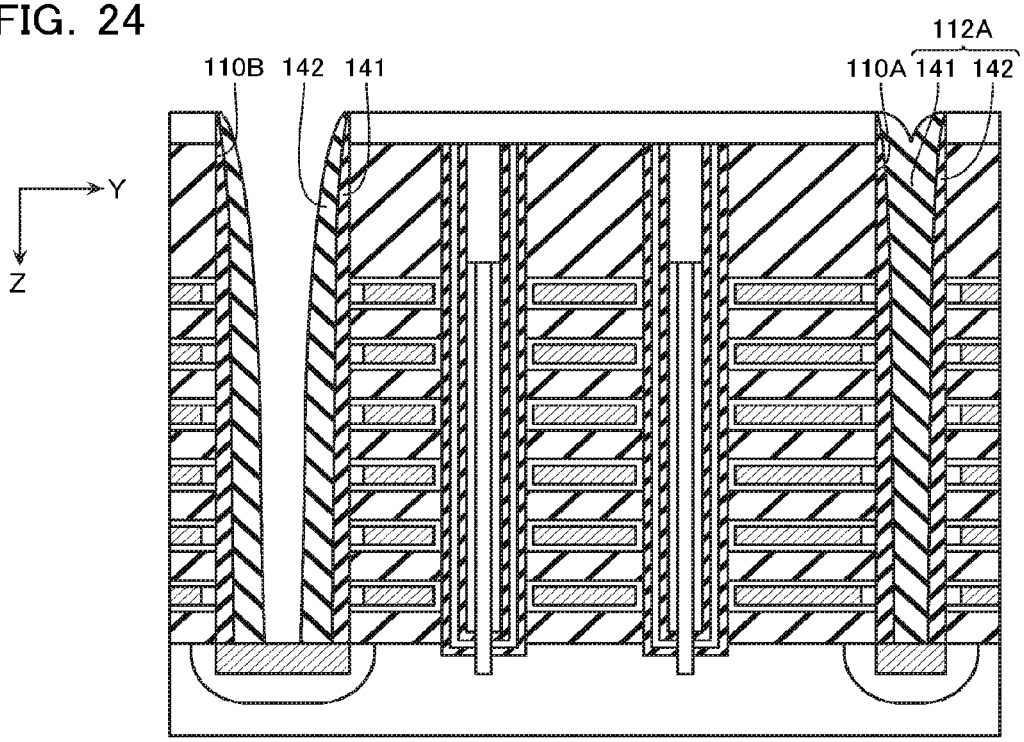
FIG. 24 is a sectional view illustrating a production process around the slit portion in the memory cell array included in the semiconductor memory device according to the fourth embodiment.

Subsequently, as illustrated in FIG. 24, the second insulation film 142 is formed in the grooves 110A and 110B via the first insulation film 141 to such a degree that the groove 110A is blocked up. As a result, the slit portion 112A is formed.

Figure 25:
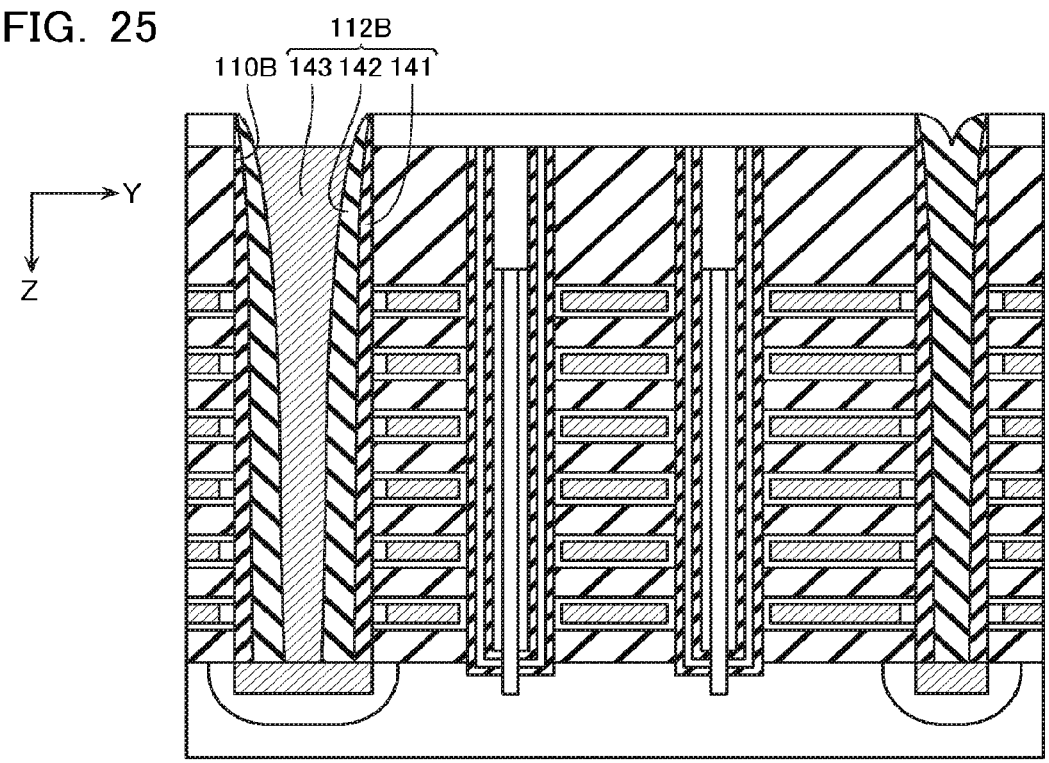
FIG. 25 is a sectional view illustrating a production process around the slit portion in the memory cell array included in the semiconductor memory device according to the fourth embodiment.

Finally, as illustrated in FIG. 25, the conductor 143 is buried in the groove 110B with the first insulation film 141 and the second insulation film 142 formed therein. As a result, the slit portion 112B is formed.

Owing to the production process described heretofore, the slit portions 112A and 112B can be formed in parallel.

According to the present embodiment, low-cost, high-performance semiconductor memory devices in the first to third embodiments can be produced.

[Rest]

Heretofore, several embodiments of the present invention have been described. However, these embodiments have been presented as examples, and it is not intended to restrict the scope of the invention. These novel embodiments can be implemented in various other forms. Various omissions, replacements, and changes can be conducted without departing from the spirit of the invention. These embodiments and their modifications are included in the scope and spirit of the invention, and included in the invention stated in claims and equivalent scope thereof.

What is claimed is:

1. A semiconductor memory device comprising:
a silicon substrate having an impurity diffusion region; and
a memory cell array including a plurality of conductive layers laminated on the silicon substrate via interlayer insulation layers, a semiconductor layer extending in a direction of the lamination of the plurality of conductive layers, a charge storage film disposed between the plurality of conductive layers and the semiconductor layer, and an electrode disposed on the plurality of conductive layers, a groove having a direction of the lamination as a depth direction and a first direction different from the lamination direction as a lengthwise direction being formed through the plurality of conductive layers,
the silicon substrate including a silicide film disposed in the impurity diffusion region along the groove, and
the memory cell array including a conductor, which is in contact with the electrode and the silicide film, in the groove, the conductor having a length in the first direction shorter than a length of the groove in the first direction.

2. The semiconductor memory device according to claim 1, wherein the silicide film includes cobalt silicide or nickel silicide.

3. The semiconductor memory device according to claim 1, wherein the silicide film has a length in the first direction longer than the length of the conductor in the first direction.

4. The semiconductor memory device according to claim 1, wherein the conductor is disposed at an end portion of the groove.

5. The semiconductor memory device according to claim 1, wherein the memory cell array includes a plurality of the conductors disposed in the groove via insulation films.

6. The semiconductor memory device according to claim 1, wherein the groove has a different width depending upon whether the groove is located near the conductor or located in other places.

7. The semiconductor memory device according to claim 1, wherein in the first direction, the conductor is disposed in a place where memory cells are not disposed.

8. A semiconductor memory device comprising:
a silicon substrate having an impurity diffusion region; and
a memory cell array including a plurality of conductive layers laminated on the silicon substrate via interlayer insulation layers, a semiconductor layer extending in a direction of the lamination of the plurality of conductive layers, a charge storage film disposed between the plurality of conductive layers and the semiconductor layer, and an electrode disposed on the plurality of conductive layers, a groove having a direction of the lamination as a depth direction and a first direction different from the lamination direction as a lengthwise direction being formed through the plurality of conductive layers,
the memory cell array including first and second grooves as the groove,
the silicon substrate including a first silicide film disposed in the impurity diffusion region along the first groove disposed and a second silicide film disposed in the impurity diffusion region along the second groove, and
the memory cell array including a conductor, which is in contact with the electrode and the second silicide film, in the second groove, the second silicide film being in contact with the first silicide film.

9. The semiconductor memory device according to claim 8, wherein each of the first silicide film and the second silicide film includes cobalt silicide or nickel silicide.

10. The semiconductor memory device according to claim 8, wherein the first groove has a width narrower than that of the second groove.

11. The semiconductor memory device according to claim 8, wherein a contact portion between the first silicide film and the second silicide film is in an end portion of the first groove.

12. The semiconductor memory device according to claim 8, wherein a contact portion between the first silicide film and the second silicide film is T letter formed.

13. The semiconductor memory device according to claim 8, wherein a contact portion between the first silicide film and the second silicide film takes a shape of a straight line.

14. The semiconductor memory device according to claim 8, wherein in the first direction, the conductor is disposed in a place where memory cells are not disposed.

15. The semiconductor memory device according to claim 8, wherein the memory cell array is divided into a plurality of memory blocks having the second groove as a boundary.

* * * * *